United States Patent
Turner et al.

(10) Patent No.: US 6,533,613 B1
(45) Date of Patent: Mar. 18, 2003

(54) SHIELDED ZERO INSERTION FORCE SOCKET

(75) Inventors: Leonard O. Turner, Sherwood, OR (US); Tony Hamilton, Durham, NC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/467,995

(22) Filed: Dec. 20, 1999

(51) Int. Cl.⁷ .............................................. H01R 13/648
(52) U.S. Cl. ......................................... 439/608; 439/70
(58) Field of Search ........................... 439/608, 70, 74, 439/82, 607, 609, 610; 174/250, 261, 265, 266; 361/794

(56) References Cited

U.S. PATENT DOCUMENTS

| | | | | |
|---|---|---|---|---|
| 4,440,463 A | * | 4/1984 | Glina, Jr. et al. | 339/14 R |
| 4,606,598 A | * | 8/1986 | Drzymlowski et al. | 339/147 R |
| 5,286,926 A | * | 2/1994 | Kimura et al. | 174/250 |
| 5,707,247 A | | 1/1998 | Konstad | 439/342 |
| 5,734,555 A | | 3/1998 | McMahon | 361/704 |
| 5,923,179 A | | 7/1999 | Taylor | 324/755 |

* cited by examiner

*Primary Examiner*—P. Austin Bradley
*Assistant Examiner*—Alexander Gilman
(74) *Attorney, Agent, or Firm*—Fish & Richardson P.C.

(57) ABSTRACT

A shielded socket includes a conducting plate including a plurality of apertures, and an insulating layer. The insulating layer surrounds the conducting plate and lines at least one aperture. In an implementation, the conducting plate includes at least one grounding site.

5 Claims, 4 Drawing Sheets

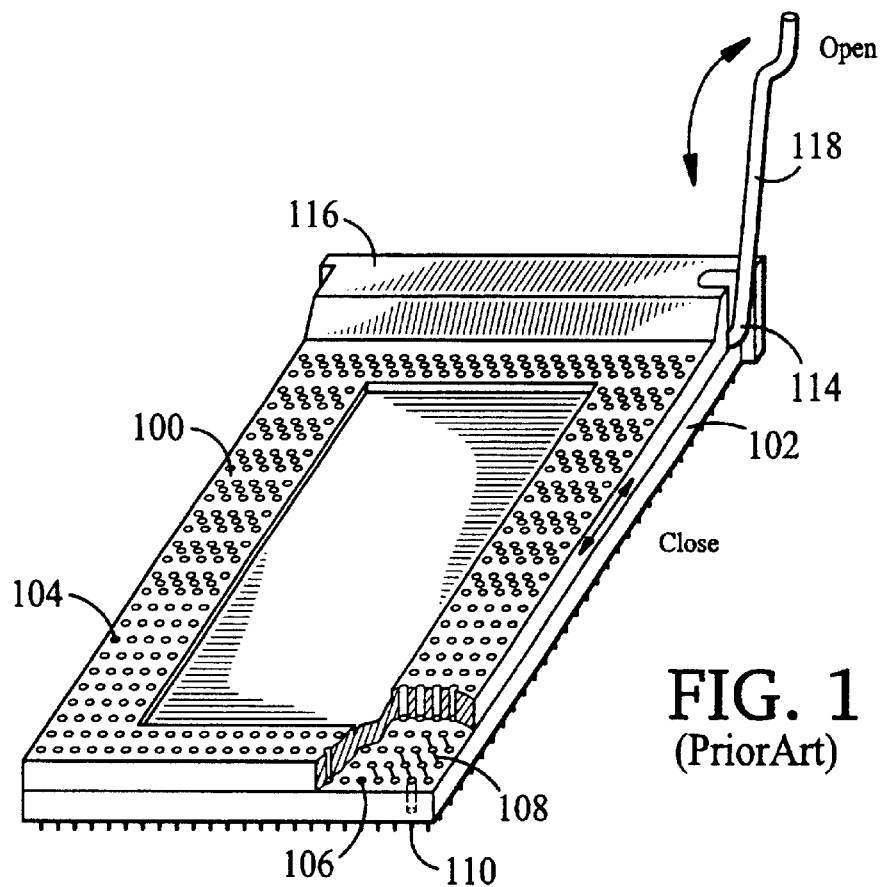
FIG. 1
(PriorArt)

SHIELDED ZERO INSERTION FORCE SOCKET

BACKGROUND OF THE INVENTION

The invention relates to zero insertion force (ZIF) sockets.

Zero insertion force sockets are commonly used to attach integrated-circuit (IC) modules to printed circuit (PC) boards. As shown in FIG. 1, a known ZIF socket includes a top plate 100 that is slideably attached to a base 102. Top plate 100 contains apertures 104 and the base 102 contains a corresponding number of openings 106. The openings 106 house spring elements 108, each of which has a tail portion 110 that is soldered to the PC board. The ZIF socket further includes a camshaft 114 located inside a raised portion 116 of top plate 100. Rotating a lever 118 causes camshaft 114 to act on base 102, displacing top plate 100 with respect to base 102, which is anchored to the PC board via the tail portions 110.

The terminals or pins of an IC module, such as a microprocessor, are inserted into an open ZIF socket, and protrude through apertures 104 of top plate 100. With the socket in its open position, apertures 104 and corresponding spring elements 108 are not aligned, so that no contact exists between the pins of the IC module and spring elements 108. The lever 118 is then rotated downwards, the camshaft 114 exerts a force on base 102 which causes top plate 100 to translate relative to base 102, such that the pins of the IC module and spring elements 108 align and engage.

New, faster, lower voltage microprocessor bus circuits are more susceptible to failure or performance degradation due to noise on many signal lines. Conventional ZIF sockets for use with such circuits do not prevent crosstalk or other noise which could occur between adjacent pins.

SUMMARY OF THE INVENTION

A shielded socket for use in a zero-insertion-force (ZIF) socket assembly is presented. The socket includes a conducting plate including a plurality of apertures, and an insulating layer. The insulating layer surrounds the conducting plate and lines at least one signal carrying passageway. In an implementation, the conducting plate includes at least one grounding site. A slider plate assembly may be included that slideably connects to an outside wall of the insulating layer to form the ZIF socket assembly.

A ZIF socket assembly according to the invention is compatible with high front or back-side bus speeds (i.e. speeds currently being developed for future central processing unit (CPU) components) because it reduces cross-talk between the pins of the CPU. In addition, the shielded ZIF socket has a low profile configuration, which minimizes the potential for signal degradation and timing problems due to excessive trace length. Thus, such a shielded, low-profile ZIF socket finds applications in high-bus-speed CPU socketing, especially for thin notebook computers.

Other advantages and features of the invention will become apparent from the following description and the claims.

BRIEF DESCRIPTION OF THE DRAWINGS

FIG. 1 is a perspective, partially-sectional view of a known ZIF socket.

DETAILED DESCRIPTION

Figure 2:
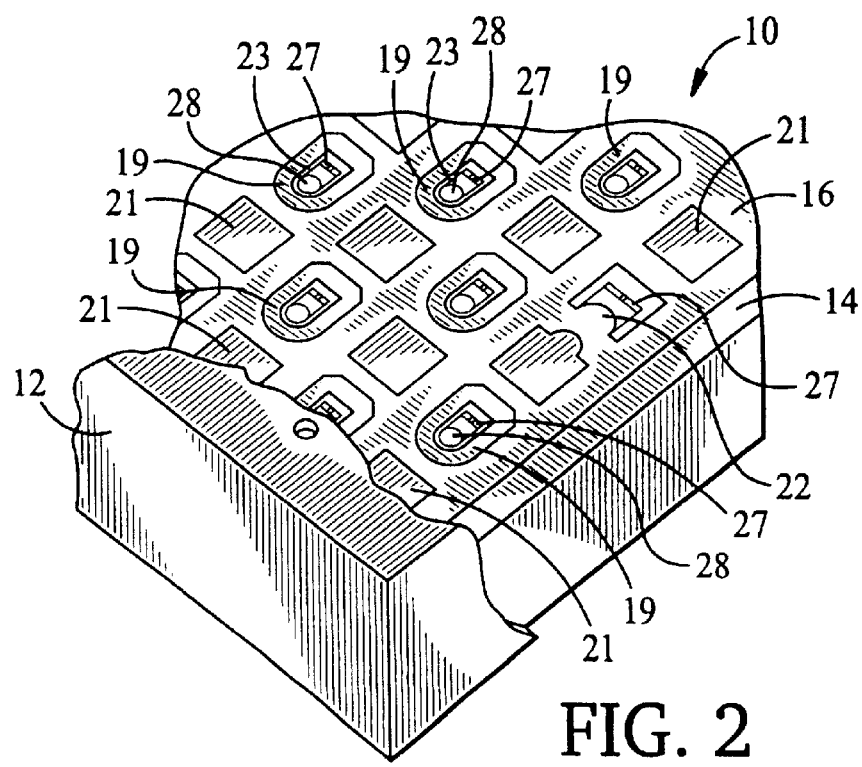
FIG. 2 is an enlarged, cutaway, perspective view of a portion of a shielded ZIF socket according to the invention.

FIG. 2 is an enlarged, cutaway view of a portion of a shielded, low-profile, ZIF socket assembly 10 for positioning on a PC board (e.g. a motherboard). The ZIF socket includes a slider plate assembly 12 (only a small portion of which is shown), an insulating layer 14 and a conducting plate 16. The sliding plate assembly 12 includes openings 32 (shown in FIG. 6) for accepting the pins of an IC device.

Figure 3:
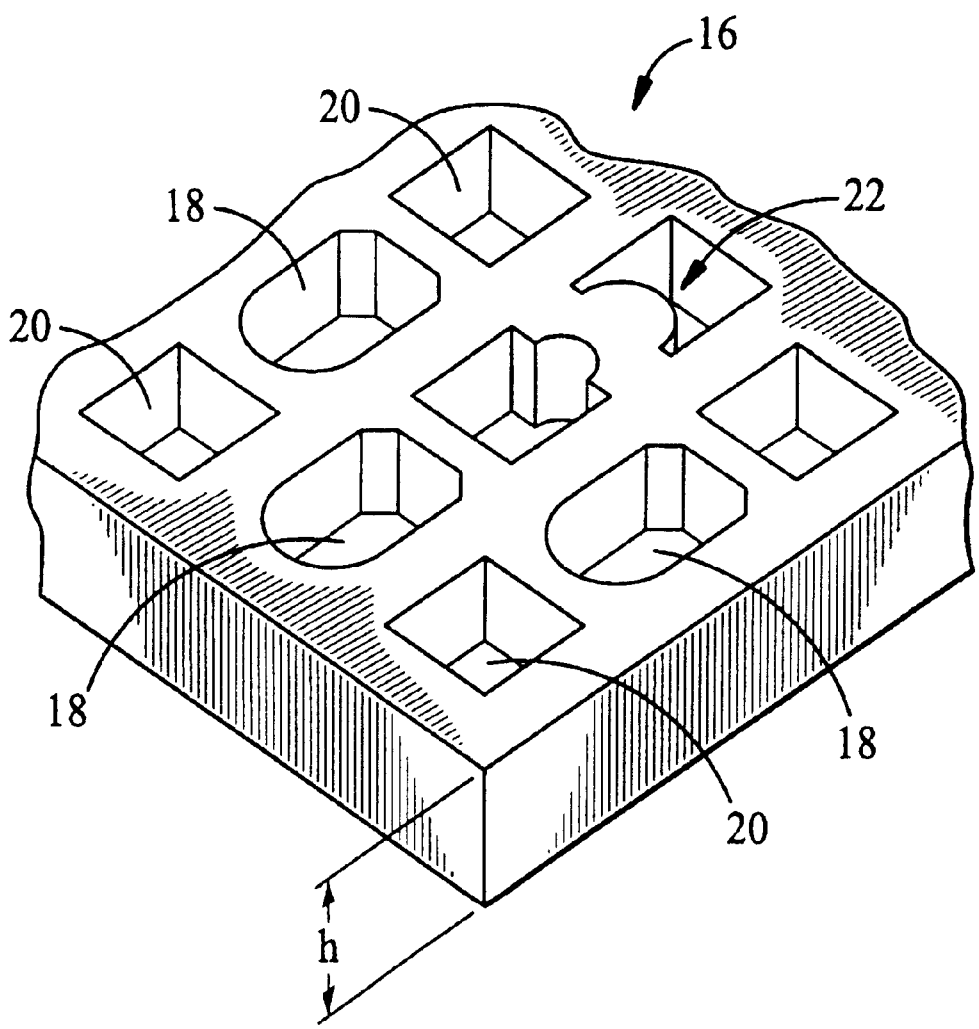
FIG. 3 is an enlarged, perspective view of a portion of a conducting plate.

FIG. 3 is an enlarged, perspective view of a portion of a conducting plate 16 that is substantially similar to that of FIG. 2 except that the illustrated portion includes a plate grounding site 22 in a different location. The conducting plate has a height "h", and includes oblong apertures 18, substantially square openings 20 and the grounding site 22. The conducting plate may be fabricated by a metal injection mold process, a metal extrusion process, or may be formed from a metal-plated or metal-filled plastic composition.

Figure 4:
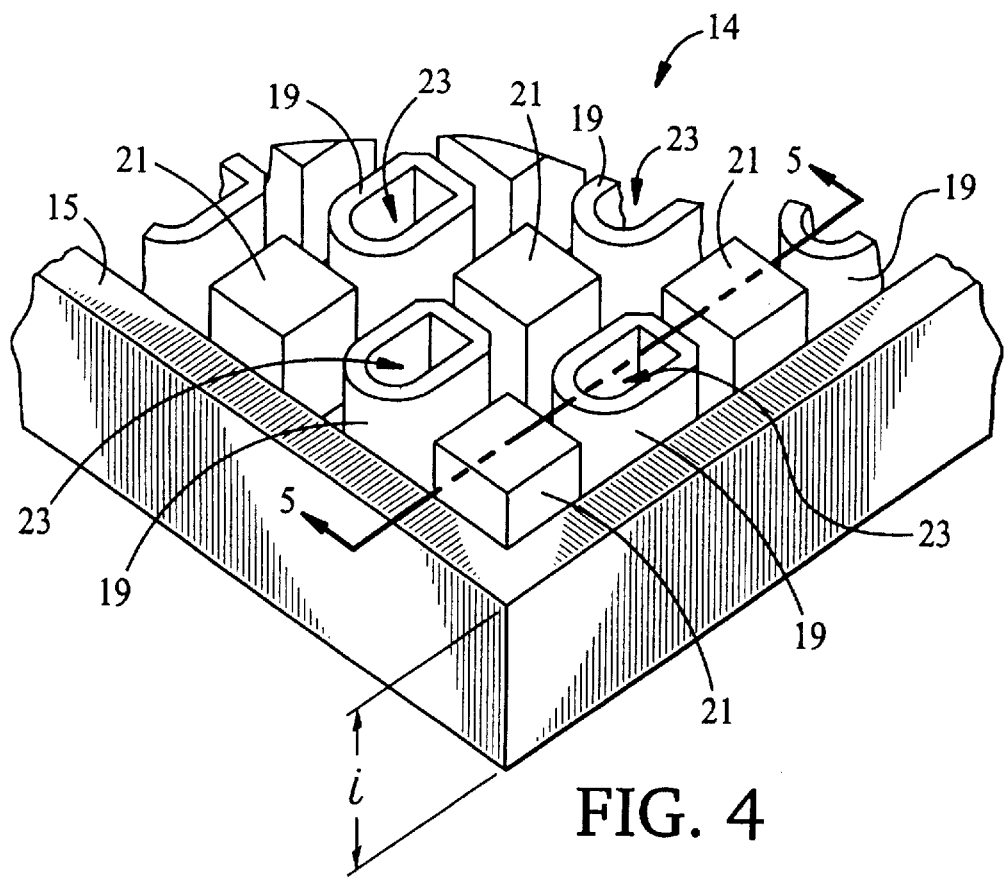
FIG. 4 is an enlarged, perspective view of a portion of an insulating layer.

FIG. 4 is an enlarged, perspective view of a portion of an insulating layer 14 that is substantially similar to that of FIG. 2 except that FIG. 4 does not portray a grounding site area. The insulation layer is shown as a separate piece for ease of understanding and may be fabricated as an overmold layer over the conducting plate. The insulating layer is formed of insulating material and includes an outside wall 15 having a height "i" and dimensioned to surround the outside portion of the conducting plate 16. Also included are a plurality of chimney structures 19 and a plurality of blocks 21 that are dimensioned to fit into the apertures 18 and openings 20, respectively, of the conducting plate (see FIG. 3). The chimneys 19 include passageways 23 for accommodating the pins of an IC device. When fabricating the ZIF socket, socket springs (not shown) for contacting the terminals of the IC device are connected within the passageways 23 in a known manner. The socket springs include tail portions for soldering or otherwise fastening to a PC board.

Figure 5:
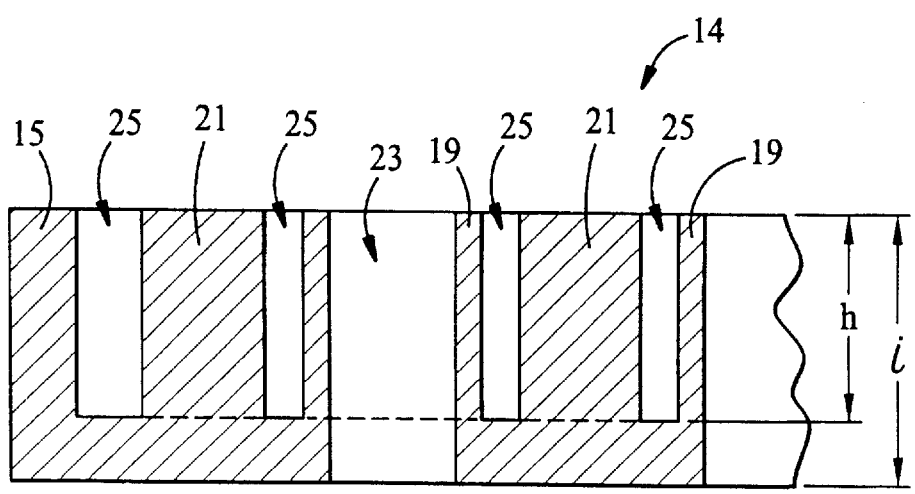
FIG. 5 is an enlarged, cross-sectional view taken along dotted line 5—5 of FIG. 4.

FIG. 5 is an enlarged, cross-sectional view of the insulating layer 14 taken along dotted line 5—5 of FIG. 4. As shown, the insulating layer 14 includes a base portion 17 that lies on top of the conducting plate 16 when combined to form the shielded socket shown in the ZIF socket assembly 10 of FIG. 2. The length "h" corresponds to the height of the conducting plate 16 (see FIG. 3), and the length "i" corresponds to the length of the outside walls 15 of the insulating layer. The conducting plate openings 20 and oblong apertures 18 receive the insulating layer blocks 21 and chimneys 19. The conducting plate thus fits into the gaps 25 between the chimney structures 19 and blocks 21.

Figure 6:
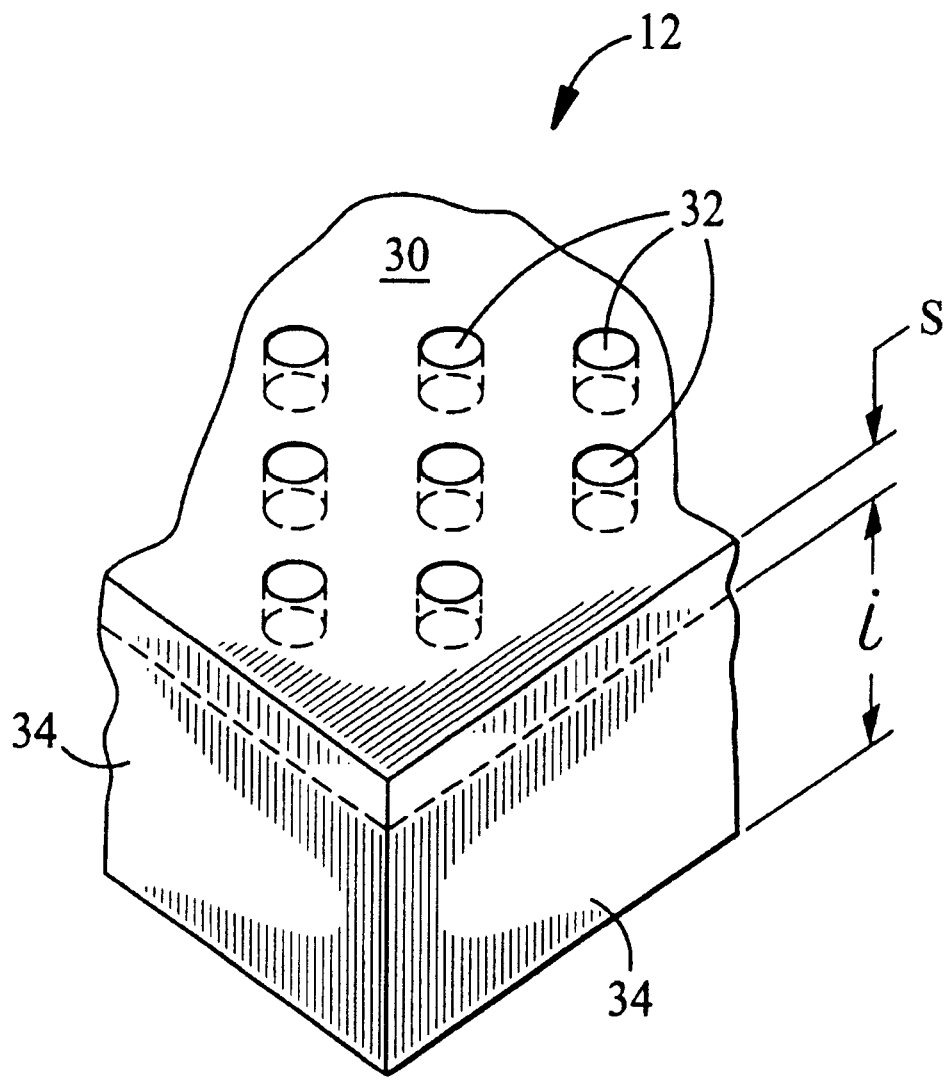
FIG. 6 is an enlarged, perspective top view of a portion of a slider assembly.

FIG. 6 is an enlarged, perspective top view of a slider assembly 12 for receiving the pins of an IC device. The slider assembly is made of an insulating material such as plastic, and includes a slider plate 30 having a thickness "s" and through holes 32 whose length "s" is shown in dotted lines. Walls 34 about the periphery of the slider plate are dimensioned to slideably connect to the outside walls 15 of the insulating layer 14. The thickness "s" of the slider plate 30 is a small portion of the length of a pin of an IC device, and the walls 34 have a height "i" equal to or slightly shorter than the length of the outside walls 15 of the insulating layer 14 (see FIG. 4).

The ZIF socket may be fabricated by first designing and creating the conducting plate 16 and then molding an insulating substance over the plate to form the insulating layer 14. If such a process is used, care must be taken to ensure that the apertures 18 are lined with insulating material to create passageways 23 for the pins of an IC device.

Referring again to FIG. 2, spring contacts 27 and truncated IC pins 28 (shown for ease of understanding) are partially visible through the passageways 23 of the chimneys 19. The contacts are typically beryllium copper springs mounted by machine in the passageways, and each may include a tapered contact body for embracing the pins of the IC device. The contact body may have a large surface contact area to provide reduced impedance at high digital frequencies to improve the electrical performance of the ZIF socket.

The grounding site 22 shown in FIG. 2 is a bump on the conducting plate 16 that presses into a contact terminal 27 in the same manner as that of an IC component pin. In an alternate implementation, a portion of the conducting plate 16 may be configured to contact a ground pin of the IC device, which pin in turn presses into a grounded terminal connected to the PC board. An implementation may include a plurality of ground sites designed into the conducting plate 16 as needed. The ZIF socket assembly 10 thus provides a grounded enclosure for each sensitive pin of an IC device, and the structure shields the pins from outside interference and from crosstalk. The grounded metal sheath about a substantial portion of the length of a pin attenuates the lines of flux that induce noise in neighboring pins when the IC component is powered and operating.

The implementation illustrated in the drawings requires that the slider plate assembly 12 move in a orthogonal direction with reference to the pin array of the IC device to ensure proper IC pin contact with the spring contacts 27. But other slider plate geometries could be designed that require movement in a direction diagonal to one of the sides of the IC component, or movement in some other angular direction.

Each passageway 23 of the illustrated ZIF socket assembly 10 creates a grounded metallic shield around a substantial percentage of the length of a signal-carrying pin of an IC device. The blocks 21 are insulating structures that provide an additional buffer between adjacent IC pins. The geometry of the conducting plate 16 and the insulating overlay layer 14 can be manipulated to minimize signal wave-shape degradation that occurs when high-speed signals pass through ordinary socket terminal sets. In particular, a design may be provided having a dielectric gap between signal carrying metal (pins) and the grounding metal (the plate) in the ZIF socket that approximates the dielectric gap between the signal trace ground planes of a well designed PC board. Consequently, the edges of the signals of the IC device on the pins remain sharp as the signal moves through the ZIF socket.

In some ZIF socket applications only certain of the terminal locations may need shielding. Consequently, a ZIF socket assembly 10 could be created that provides shielding for only those terminals of an IC device that carry noise-generating and/or noise susceptible signals. For example, if a particular packaging option of a CPU chip requires shielding for the pins of a certain row and column, then the conducting plate 16 and insulating layer 14 could be designed and fabricated accordingly. However, to make the ZIF socket assembly 10 universally usable, shielding for all of the pins that could possibly be assigned signal carrying duty may be provided.

While exemplary implementations have been described and shown in the drawings, such implementations are merely illustrative and are not restrictive of the broad invention. Consequently, other implementations are also within the scope of the following claims.

What is claimed is:

1. A shielded socket for an integrated circuit device, comprising:

a substantially flat conducting plate including a plurality of passageways and at least one grounding site; and an insulating layer having a thickness greater than the thickness of the conducting plate and surrounding the conducting plate and shielding each passageway to provide a grounded enclosure for each pin of an integrated circuit device;

wherein the conducting plate comprises a plurality of openings and the insulating layer comprises a plurality of insulating structures filling the openings.

2. The apparatus of claim 1, further comprising a plurality of grounding sites associated with the conducting plate.

3. The apparatus of claim 1, further comprising a slider plate assembly connected to the insulating layer.

4. A shielded, zero-insertion-force (ZIF) socket assembly, comprising:

a slider assembly for receiving the pins of an IC device; and a shielded socket slideably connected to the slider assembly, the shielded socket including a substantially flat conducting plate having a plurality of terminal apertures, at least one grounding site, and an insulating layer having a thickness greater than a thickness of the conducting plate, wherein each terminal aperture provides a grounded enclosure for each pin of the IC device, wherein the conducting plate comprises a plurality of openings and the insulating layer comprises a plurality of insulating structures filing the openings.

5. The assembly of claim 4, further comprising a plurality of grounding sites associated with the conducting plate.

* * * * *